(12) United States Patent
Inagaki et al.

(10) Patent No.: US 6,472,080 B1
(45) Date of Patent: Oct. 29, 2002

(54) THIN COPPER FILM DIRECTLY BONDED POLYIMIDE FILM AND METHOD OF MANUFACTURING THE SAME

(75) Inventors: Norihiro Inagaki, Hamamatsu; Shigeru Tasaka, Shizuoka, both of (JP)

(73) Assignee: President of Shizuoka University, Shizuoka (JP)

( * ) Notice: Subject to any disclaimer, the term of this patent is extended or adjusted under 35 U.S.C. 154(b) by 0 days.

(21) Appl. No.: 09/680,268

(22) Filed: Oct. 6, 2000

(30) Foreign Application Priority Data

Jun. 27, 2000 (JP) .......................................... 2000-192815

(51) Int. Cl.$^7$ .............................................. B32B 15/08
(52) U.S. Cl. .................... 428/450; 427/387; 427/393.5; 427/535; 427/536; 428/451; 428/458; 428/473.5
(58) Field of Search .................... 428/450, 451, 428/458, 473.5; 427/387, 393.5, 535, 536

(56) References Cited

U.S. PATENT DOCUMENTS

| 3,652,761 A | 3/1972 | Weetall ........................ 424/12 |
| 4,778,724 A | 10/1988 | Bragole ....................... 428/414 |
| 5,011,410 A | 4/1991 | Culler et al. ................. 433/208 |
| 5,538,927 A | 7/1996 | Tsuzuki et al. ................ 501/97 |
| 5,616,369 A | 4/1997 | Williams et al. ............. 427/536 |
| 5,693,928 A | 12/1997 | Egitto et al. ........... 204/157.15 |
| 5,770,301 A | 6/1998 | Murai et al. ................. 428/213 |
| 5,849,397 A | * 12/1998 | Kohno et al. ............... 428/209 |
| 5,936,703 A | 8/1999 | Miyazaki et al. ....... 351/160 R |
| 6,027,793 A | 2/2000 | Lohwasser et al. ......... 428/216 |

FOREIGN PATENT DOCUMENTS

WO    WO 93/24243    12/1993

* cited by examiner

*Primary Examiner*—D. S. Nakarani
(74) *Attorney, Agent, or Firm*—Oblon, Spivak, McClelland, Maier & Neustadt, P.C.

(57) ABSTRACT

Provided is a thin copper film directly bonded polyimide film in which a thin copper film is directly and strongly connected to a polyimide film. This thin copper film directly bonded polyimide film includes a polyimide film modified by bonding an organic silane compound having a cyano group represented by formula —Si(R—CN)$_n$ (wherein R represents alkyl group having 1 to 6 carbon atoms and n represents a positive number from 1 to 3) to a carbon atom on the surface of the polyimide film, and a thin copper film directly bonded to the modified surface of the polyimide film.

11 Claims, 1 Drawing Sheet

THIN COPPER FILM DIRECTLY BONDED POLYIMIDE FILM AND METHOD OF MANUFACTURING THE SAME

CROSS-REFERENCE TO RELATED APPLICATIONS

This application is based upon and claims the benefit of priority from the prior Japanese Patent Application No. 2000-192815, filed Jun. 27, 2000, the entire contents of which are incorporated herein by reference.

BACKGROUND OF THE INVENTION

The present invention relates to a thin copper film directly bonded polyimide film used as a material of a flexible printed circuit board or the like and a method of manufacturing the same.

A polyimide film has high mechanical strength, high heat resistance, and good insulation properties. Therefore, a composite material combining this film with copper is used as a material of a flexible printed circuit board (FPC).

A polyimide film has low adhesion to copper. Hence, to combine a polyimide film with copper, a thin copper film (e.g., a copper foil) is adhered to the polyimide film via an adhesive. However, combining a polyimide film with a copper foil by an adhesive makes it difficult to decrease the thickness of a flexible printed circuit board as a final product owing to the presence of the adhesive layer. Also, the heat resistance of the flexible printed circuit board is limited by the heat resistance of the adhesive layer, and this limits the use of the product.

BRIEF SUMMARY OF THE INVENTION

It is an object of the present invention to provide a thin copper film directly bonded polyimide film in which a thin copper film is directly and strongly connected to a polyimide film, and a method of manufacturing the same.

According to the present invention, there is provided a thin copper film directly bonded polyimide film comprising a polyimide film modified by bonding an organic silane compound having a cyano group represented by formula —Si(R—CN)$_n$ (wherein R represents alkyl group having 1 to 6 carbon atoms and n represents a positive number from 1 to 3) to a carbon atom on a surface of the film, and a thin copper film directly bonded to the modified surface of the polyimide film.

According to the present invention, there is also provided a method of manufacturing a thin copper film directly bonded polyimide film, comprising the steps of:

activating carbon atoms of a surface of a polyimide film by subjecting the polyimide film to a plasma treatment, the activated carbon atoms being subsequently exposed to air atmosphere to allow to be bonded with oxygen to the active carbon atoms, thereby introducing an oxygen functional group into the surface of the polyimide film;

allowing a coupling reaction to take place between the oxygen functional group of the polyimide film and a silane coupling agent represented by formula (R'O)$_{(4-n)}$—Si(R—CN)(wherein each of R and R' represents alkyl group having 1 to 6 carbon atoms and n represents a positive number from 1 to 3) to introduce an organic silane compound having a cyano group represented by formula —Si(R—CN)(wherein R represents alkyl group having 1 to 6 carbon atoms and n represents a positive number from 1 to 3) to the carbon atoms on the surface of the polyimide film, thereby modifying the surface of the polyimide film; and forming a thin copper film on the surface of the modified polyimide film by vacuum evaporation or sputtering of copper.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

The single FIGURE is a perspective view showing a plasma processing apparatus used in examples of the present invention.

DETAILED DESCRIPTION OF THE INVENTION

Figure 1:
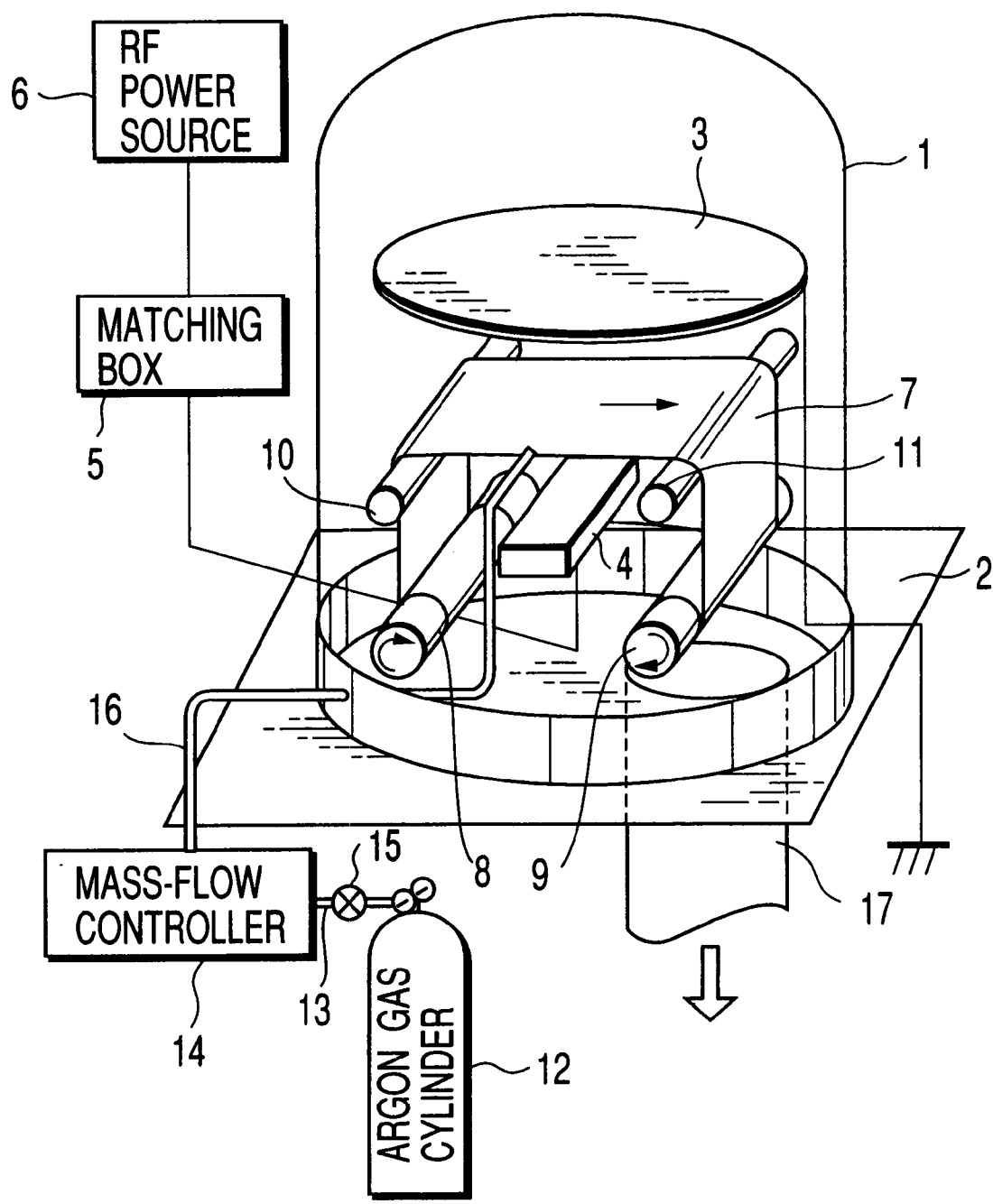

The present invention will be described in detail below.

A thin copper film directly bonded polyimide film of the present invention comprises a polyimide film modified by bonding an organic silane compound having a cyano group represented by formula —Si(R—CN)$_n$(wherein R represents alkyl group having 1 to 6 carbon atoms and n represents a positive number from 1 to 3) to a carbon atoms on a surface of the film, and a thin copper film directly bonded to the modified surface of the polyimide film. The surface of the polyimide film to be modified means one surface or both surfaces.

Kapton (trade name) manufactured by Toray Du Pont is an example of the polyimide film.

This polyimide film preferably has a thickness of 10 to 100 μm.

One example form of "an organic silane compound having a cyano group is bonded to a carbon atoms on the surface of the polyimide film" is that Si of formula —Si(R—CN)$_n$described above is bonded to a carbon atoms of the polyimide via oxygen (—O—). Note that this Si can be bonded to Si of another organic silane compound via oxygen (—O—).

Examples of the thin copper film are a single thin copper film formed by vacuum evaporation or sputtering and a two-layered thin copper film manufactured by forming a thin copper-electroplated film on the surface of the former thin copper film. In the case of the latter thin copper film, the thickness of the thin copper film formed by vacuum evaporation is preferably 20 to 200 nm, and the thickness of the thin copper-electroplated film is preferably 20 to 40 μm.

To manufacture a flexible printed circuit board by using the thin copper film directly bonded polyimide film according to the present invention as a raw material, a method is used which forms a mask having a desired pattern on the thin copper film on the polyimide film, and forms a copper circuit pattern by selectively etching away portions of the thin copper film exposed from this mask by a copper etchant.

A method of manufacturing the thin copper film directly bonded polyimide film according to the present invention will be described below.

(First Step)

First, the carbon atoms existing in the surface region of polyimide film is subjected to a plasma treatment so as to activate carbon atoms, and then, the activated carbon atoms are exposed to air atmosphere to allow the activated carbon atoms to be bonded with oxygen, thereby introducing an oxygen functional group into the surface of the polyimide film. This introduction of the oxygen functional group can be detected by making use of an XPS spectral analyzer.

As the polyimide film, it is possible to use, e.g., Kapton (trade name) manufactured by Toray Du Pont. This polyimide film preferably has a thickness of 10 to 100 μm.

The plasma treatment should preferably be performed by making use an argon plasma (argon atmosphere). By the way, when the polyimide film is subjected to a plasma treatment using a gas atmosphere containing a relatively large amount of oxygen, the oxidizing reaction of polyimide becomes violent, thereby greatly damaging to the surface of the polyimide film, thus deteriorating the inherent properties of the polyimide film.

Preferably, the plasma treatment should be performed using a DC or high-frequency(up to about 24 GHz) power source and under the condition of 25 to 500 W in output, 0.03 to 3 Torr, in in-chamber pressure, 1 to 10 cc/min in gas flow rate, and 5 seconds to 3 minutes in treatment time.

The oxygen functional group is introduced in the form of, e.g., C—O—H to a carbon atom of the polyimide film. The introduction amount of this oxygen functional group on the surface of the polyimide film is preferably 0.23 to 0.60 as an atomic ratio (i.e., $Q_O/Q_C$ where $Q_C$ represents the total carbon atoms constituting the surface of the polyimide and $Q_O$ is number of oxygen functional group, each partially bonded to a carbon atom). If this $Q_O/Q_C$ is less than 0.23, the amount of introduction of the oxygen functional group to the polyimide surface decreases. This may make it difficult to well increase the degree of coupling reaction of a silane coupling agent with respect to the polyimide film. On the other hand, if the $Q_O/Q_C$ exceeds 0.60, the amount of introduction of the oxygen functional group to the surface of the polyimide film becomes too large, and this may degrade the original characteristics (e.g., the mechanical strength) of the polyimide film. The introduction amount ($Q_O/Q_C$) of the oxygen functional group is preferably 0.24 to 0.50.

(Second Step)

Subsequently, a silane coupling agent represented by formula $(R'O)_{(4-n)}$—Si(R—CN)$_n$(wherein each of R and R' represents alkyl group having 1 to 6 carbon atoms and n represents a positive number from 1 to 3) is contacted with the polyimide film, thereby allowing a coupling reaction to take place between the oxygen functional group of the polyimide film and a silane coupling agent. In the coupling reaction, an organic silane compound having a cyano group represented by formula —Si(R—CN)(wherein R represents alkyl group having 1 to 6 carbon atoms and n represents a positive number from 1 to 3) is introduced to the carbon atoms on the surface of the polyimide film via, e.g., oxygen (—O—), thereby modifying the surface of the polyimide film.

Examples of the silane coupling agent are 2-cyanoethyltrimethoxysilane [CES;

(OCH$_3$)$_3$—Si—CH$_2$CH$_2$—CH] and
3-cyanopropyltrimethoxysilane [CPS; (OCH$_3$)$_3$—Si—CH$_2$CH$_2$CH$_2$—CH].

Preferably, this coupling reaction should be performed by a process wherein the polyimide film having the aforementioned oxygen functional group introduced therein is immersed in an alcohol solution of the silane coupling agent, and then heated in the alcohol solution.

Although alcohol used in the coupling reaction is not particularly restricted, methanol or ethanol having high vapor pressure is preferred.

The concentration of the alcohol solution of the silane coupling agent used in the coupling reaction is preferably 0.1 to 10 wt %. If the concentration of this alcohol solution is less than 0.1 wt %, it may be become difficult to allow the coupling reaction to sufficiently take place. On the other hand, if the concentration of the alcohol solution exceeds 10 wt %, not only the silane coupling agent couples with the oxygen functional group introduced to the surface of the polyimide film, but also components of the silane coupling agent condense with each other, thereby generating unwanted substances on the surface of the polyimide film.

The heating temperature in the coupling reaction should preferably be controlled within the range of 50 to 80° C.

(Third Step)

A thin copper film is formed on the modified polyimide film surface by vapor evaporation or sputtering of copper. After that, a thin copper-electroplated film is deposited, where necessary, on this thin copper film by electroplating of copper, thereby manufacturing a thin copper film directly bonded polyimide film.

The thickness of the thin copper film formed is preferably 20 to 200 nm. The thickness of the thin copper-electroplated film is preferably 20 to 40 μm.

In the present invention as described above, a thin copper film is directly bonded on the surface of a polyimide film, and an organic silane compound having a cyano group represented by formula —Si(R—CN)$_n$(where R represents alkyl group having 1 to 6 carbon atoms and n represents a positive number from 1 to 3) is bonded to a carbon atoms on the surface of the polyimide film to modify the surface of the polyimide film. Accordingly, it is possible to obtain a thin copper film directly bonded polyimide film in which the thin copper film is directly and firmly bonded to the polyimide film. The bonding properties of the thin copper film with respect to the polyimide film are improved because the organic silane compound represented by the above formula used to modify the surface of the polyimide film has a cyano group for improving the bonding properties with copper at its terminal end.

In the thin copper film directly bonded polyimide film according to the present invention, therefore, the polyimide film and the thin copper film are directly and tightly bonded without any adhesive interposed between them. Hence, when the thin copper film of this material is patterned by selective etching by the aforementioned method, it is possible to obtain a flexible printed circuit board having a thickness decreased by the thickness of an adhesive layer and having high heat resistance of polyimide without being influenced by the heat resistance of an adhesive.

A method of manufacturing a thin copper film directly bonded polyimide film according to the present invention comprises the steps of activating carbon atoms of a surface of a polyimide film by subjecting said polyimide film to a plasma treatment, the activated carbon atoms being subsequently exposed to air atmosphere to allow to be bonded with oxygen to the active carbon atoms, thereby introducing an oxygen functional group into the surface of the polyimide film, allowing a coupling reaction to take place between the oxygen functional group of the polyimide film and a silane coupling agent represented by formula $(R'O)_{(4-n)}$—Si(R—CN)$_n$(wherein each of R and R' represents alkyl group having 1 to 6 carbon atoms and n represents a positive number from 1 to 3) to introduce an organic silane compound having a cyano group represented by formula —Si (R—CN)$_n$(wherein R represents alkyl group having 1 to 6 carbon atoms and n represents a positive number from 1 to 3) to the carbon atoms on the surface of the polyimide film, thereby modifying the surface of the polyimide film, and forming a thin copper film on the surface of the modified polyimide film by vacuum evaporation or sputtering of copper.

In the present invention as described above, it is possible to manufacture a thin copper film directly bonded polyimide film in which a polyimide film and a thin copper film are directly and strongly bonded with no adhesive interposed between them.

In particular, when the introduction amount of the oxygen functional group to the surface of the polyimide film is set to the range 0.23 to 0.60, more preferably, 0.24 to 0.50 as an atomic ratio (i.e., $Q_O/Q_C$ where $Q_C$ represents the total carbon atoms constituting the surface of the polyimide and $Q_O$ is number of oxygen functional group, each partially bonded to a carbon atom), it is possible to improve the adhesion strength of the thin copper film to the modified surface of the polyimide film.

Also, after a thin copper film is formed on the surface-modified polyimide film by vacuum evaporation or sputtering of copper, a thin copper-electroplated film is further formed on the thin copper film by electroplating of copper. Consequently, a thin copper film having superior electric characteristics such as low resistance can be formed on the polyimide film.

Accordingly, the present invention can provide a method of manufacturing a thin copper film directly bonded polyimide film in which a polyimide film and a thin copper film are directly and tightly bonded with no adhesive interposed between them, which has a thickness decreased by the thickness of an adhesive layer, which has high heat resistance of polyimide without being influenced by the heat resistance of an adhesive, and which is useful as a material in the manufacture of a flexible printed circuit board or the like.

Preferred examples will be described in detail below.

FIG. 1 is a perspective view showing a plasma processing apparatus used in the examples.

The reference numeral 1 in this FIGURE denotes a bell jar type reaction chamber with a dimension 500 mm diameter and 590 mm height and provided at the underside thereof with a shielding plate 2. Inside this reaction chamber 1, there are disposed a circular electrode (an upper electrode) 3 with a dimension of 380 mm diameter and made of stainless steel for instance and a rectangular electrode (a lower electrode) 4 with a dimension of 50 mm wide and 100 mm long and made of stainless steel for instance, which are separated up and down with a 60 mm gap interposed therebetween. The circular electrode 3 is grounded, while the rectangular electrode 4 is connected via a matching box 5 with a high-frequency power source (RF power source) 6 for instance.

A supply roller 8 having a lengthy polyimide film 7 wound thereon and a take-up roller 9 for winding up a treated lengthy polyimide film 7 that has been fed from the supply roller 8 are also disposed inside the chamber 1. The chamber 1 is also provided therein with a pair of feed rollers 10 and 11 for feeding the lengthy OPP film 7 from the supply roller 8 to the take-up roller 9 after allowing the lengthy OPP film 7 to pass through a space between the aforementioned electrodes 3 and 4.

An argon gas cylinder 12 is connected via a pipe 13 with a mass flow controller 14. This pipe 13 is provided with valve 15. Argon that has been fed to the mass flow controller 14 is then fed to the interior of chamber 1 through a gas-feeding pipe 16, a distal end of which being interposed between the electrodes 3 and 4.

Further, an exhaust pipe 17 is connected with the shielding plate 2 attached to the underside of the chamber 1, the remote end of the exhaust pipe 17 being connected with an exhaust system (not shown) consisting of a rotary pump (displacement: 320 L/min) and a diffusion pump (displacement: 550 L/sec).

EXAMPLE 1

First, a long polyimide film (Kapton 200 H (trade name) manufactured by Toray Du Pont) 50 μm thick and 300 mm wide whose surface was previously cleaned with acetone was wound on the supply roller. This supply roller was set in the chamber shown in FIGURE. The film end portion was guided to pass between the electrodes 3 and 4 by the feed rollers 10 and 11 and wound on the take-up roller 9. The valve 15 inserted into the pipe 13 was opened to supply argon from the argon gas cylinder 12 to the mass-flow controller 14. A predetermined amount of argon was supplied from this mass-flow controller 14 to the portion between the electrodes 3 and 4 in the chamber 1 through the gas supply pipe 16. At the same time, the exhaust system including the rotary pump and diffusion pump (neither is shown) was operated to exhaust the gas in the chamber 1 through the exhaust pipe 17, thereby setting the internal pressure of the chamber 1 to 33.9 Pa. Subsequently, electric power having a frequency of 20 KHz was supplied from the electric power source 6 to the rectangular electrode (lower electrode) 4 through the matching box 5, thereby generating an argon plasma having a discharge current of 75 mA in the region between the electrodes 3 and 4 in the chamber 1.

In this operation, after the argon plasma generated between the electrodes 3 and 4 stabilized, the take-up roller 9 as rotated to feed the polyimide film 7 from the supply roller 8. The polyimide film 7 was guided by the feed rollers 10 and 11 and passed through the argon plasma region between the electrodes 3 and 4 such that the polyimide film 7 was exposed to the argon plasma for 30 sec, thereby processing the surface of the polyimide film 7 with the argon plasma. After the polyimide film wound on the supply roller was completely processed, the take-up roller 9 was extracted from the chamber 1. When polyimide film treated with the argon plasma was extracted into the atmosphere, active carbon atoms on its surface reacted with oxygen and moisture in the atmosphere to introduce an oxygen functional group in the form of, e.g., C—OH. The amount of the oxygen functional group introduced (bonded) to carbon on the polyimide film surface was measured by an XPS spectrometer (ESCA K1 (trade name) manufactured by Shimadzu Corp.) and found to be 0.29 as an atomic ratio (i.e., $Q_O/Q_C$ where $Q_C$ represents the total carbon atoms constituting the surface of the polyimide and $Q_O$ is number of oxygen functional group, each partially bonded to a carbon atom).

2-cyanoethyltrimethoxysilane (CES) was dissolved in methanol such that the concentration was 1 wt %. The plasma-processed polyimide film of the take-up roller was dipped in this methanol solution of CES at room temperature and taken up by another take-up roll. The time of dipping of this polyimide film into the solution was 10 min. Subsequently, the polyimide film extracted from the methanol solution of CES was heated for 90 min in an oven controlled at 110° C., thereby completing the coupling reaction between the oxygen functional group of the polyimide film and the CES to modify the surface of the polyimide film. After this coupling reaction, the polyimide film was cleaned with methanol by an RF cleaning machine to remove any unreacted CES from the polyimide film surface. Also, the polyimide film was dried in vacuum at 50° C.

A 0.2 μm thick copper film was deposited on the modified surface of the polyimide film by vacuum evaporation of copper. This polyimide film was dipped into an aqueous sulfuric acid solution (90 g/L) at 24° C. containing 0.5 M of copper sulfate, 50 ppm of hydrogen chloride, and 5 mL of a gloss reagent (CLX-A (trade name) manufactured by Nippon Lironal) and electroplated with copper at a current density of $3 \times 10^4$ A/m$^2$, thereby depositing a thin copper-electroplated film about 40 μm thick on the thin copper film. In this manner, a thin copper film directly bonded polyimide film was manufactured.

EXAMPLE 2

A thin copper film directly bonded polyimide film was manufactured following the same procedures as in Example 1 except that an oxygen functional group introduced to the surface of a polyimide film and silane were coupled using a methanol solution containing 1 wt % of 3-cyanopropyltrimethoxysilane (CPS).

The thin copper film directly bonded polyimide films obtained in Examples 1 and 2 had a structure in which the thin copper film was directly bonded to the polyimide film to in which Si of Si—CH$_2$CH$_2$—CN or Si—CH$_2$CH$_2$CH$_2$—CN was introduced to carbon (C) on the surface via oxygen (—O—).

COMPARATIVE EXAMPLE 1

A 0.2 μm thick copper film was deposited by vacuum evaporation of copper in the same manner as in Example 1 on a polyimide film whose surface was cleaned with acetone, without performing any argon plasma treatment and silane coupling reaction for the polyimide film, and a copper-electroplated film about 40 μm thick was further deposited, thereby manufacturing a thin copper film directly bonded polyimide film.

COMPARATIVE EXAMPLE 2

After argon plasma treatment was performed for a polyimide film whose surface was cleaned with acetone, a 0.2 μm thick copper film was deposited by vacuum evaporation of copper in the same manner as in Example 1 on the surface of the polyimide film without performing any silane coupling reaction, and a copper-electroplated film about 40 μm thick was further deposited, thereby manufacturing a thin copper film directly bonded polyimide film.

REFERENCE EXAMPLE 1

A thin copper film directly bonded polyimide film was manufactured following the same procedures as in Example 1 except that an oxygen functional group introduced to the surface of a polyimide film and silane were coupled using a methanol solution containing 1 wt % of 3-aminopropyltrimethoxysilane [APS-1; (OCH$_3$)$_3$—Si—CH$_2$CH$_2$CH$_2$—NH$_2$].

REFERENCE EXAMPLE 2

A thin copper film directly bonded polyimide film was manufactured following the same procedures as in Example 1 except that an oxygen functional group introduced to the surface of a polyimide film and silane were coupled using a methanol solution containing 1 wt % of 3-aminopropyltriethoxysilane [APS-2; (OCH$_2$CH$_3$)$_3$—Si—CH$_2$CH$_2$CH$_2$—NH$_2$].

The peel strength (N/5 mm) between the thin copper film deposited and the polyimide film of each of the thin copper film directly bonded polyimide films obtained in Examples 1 and 2, Comparative Examples 1 and 2, and Reference Examples 1 and 2 was measured at a peel rate of 10 mm/min by using an Instron tensile strength tester (AGS100-A (trade name) manufactured by Shimadzu Corp.) The results are shown in Table 1 below.

TABLE 1

|  | Plasma treatment | Silane coupling | Peel strength (N/5 mm) |
| --- | --- | --- | --- |
| Comparative example 1 | Not performed | Not performed | 0.94 |
| Comparative example 2 | Performed | Not performed | 1.50 |
| Reference example 1 | Performed | Performed (APS-1) | 0.98 |
| Reference example 2 | Performed | Performed (APS-2) | 0.90 |
| Example 1 | Performed | Performed (CES) | 2.20 |
| Example 2 | Performed | Performed (CPS) | 2.30 |

As shown in Table 1, the thin film directly bonded polyimide film of Comparative Example 2 in which thin copper films were deposited by vacuum evaporation and electroplating on the surface of a polyimide film subjected to plasma treatment and not subjected to silane coupling had a peel strength of 1.50 N/5 mm. That is, the thin copper films were bonded to the polyimide film more firmly than in the thin copper film directly bonded polyimide film of Comparative Example 1 in which thin copper films were deposited by vacuum evaporation and electroplating on the surface of a polyimide film not subjected to plasma treatment and silane coupling.

In contrast, the thin copper film directly bonded polyimide films of Examples 1 and 2 in each of which thin copper films were deposited by vacuum evaporation and electroplating to a polyimide film subjected to plasma treatment and silane coupling with CES or CPS had peel strengths of 2.20 and 2.30 N/5 mm, respectively. This indicates that the thin copper films were bonded to the polyimide film more firmly than in the thin copper film directly bonded polyimide film (peel strength: 1.50 N/5 mm) of Comparative Example 2.

The thin copper film directly bonded polyimide films of Reference Examples 1 and 2 in each of which a polyimide film treated with plasma was subjected to silane (APS-1 or APS-2 to which an amino group) coupling, and thin copper films were deposited on the surfaces of these polyimide film by vacuum evaporation and electroplating had lower peel strengths than the thin copper film directly bonded polyimide film of Comparative Example 2. The peel strengths were equivalent to that of the thin copper film directly bonded polyimide film of Comparative Example 1 having a polyimide film not subjected to plasma processing and silane coupling.

The results of Examples 1 and 2 and Reference Examples 1 and 2 described above show that not all organic silane coupling agents for coupling which have functional groups with N at their terminal ends have the effect of improving the peel strength, but a superior thin copper film directly bonded polyimide film having high peel strength can be obtained by performing silane coupling for a plasma treatment polyimide film by using a specific organic silane coupling agent having a CN group at its end as in Examples 1 and 2.

As has been described above, the present invention can provide a thin copper film directly bonded polyimide film in which a polyimide film and a thin copper film are directly and tightly bonded with no adhesive interposed between them, which has a thickness decreased by the thickness of an adhesive layer, which has high heat resistance of polyimide without being influenced by the heat resistance of an adhesive, and which is useful as a material in the manufacture of a flexible printed circuit board or the like, and a method of manufacturing the same.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A copper film directly bonded polyimide film comprising a polyimide film modified by bonding an organic silane compound having a cyano group represented by the formula —Si(R—CN)$_n$ wherein R represents an alkyl group having 1 to 6 carbon atoms and n represents a positive integer from 1 to 3 to a carbon atom on a surface of said polyimide film, and a copper film directly bonded to the modified surface of said polyimide film.

2. A film according to claim 1, wherein said copper film has a two-layered structure comprising a base copper film deposited on the surface of said polyimide film by one of vacuum evaporation and sputtering of copper, and a copper-electroplated film deposited on said base copper film by electroplating of copper.

3. A film according to claim 1, wherein said organic silane compound is 2-cyanoethyltrimethoxysilane.

4. A film according to claim 1, wherein said organic silane compound is 3-cyanopropyltrimethoxysilane.

5. A method of manufacturing the copper film directly bonded polyimide film of claim 1; comprising:

activating carbon atoms of a surface of a polyimide film by subjecting said polyimide film to a plasma treatment, the activated carbon atoms being subsequently exposed to air atmosphere to allow oxygen to be bonded with the active carbon atoms, thereby introducing an oxygen functional group into the surface of the polyimide film;

allowing a coupling reaction to take place between the oxygen functional group of the polyimide film and a silane coupling agent represented by the formula (R'O)$_{(4-n)}$—Si(R—CN)$_n$ wherein each of R and R' represents an alkyl group having 1 to 6 carbon atoms and n represents a positive integer from 1 to 3 to introduce an organic silane compound having a cyano group represented by formula —Si(R—CN)$_n$ wherein R represents an alkyl group having 1 to 6 carbon atoms and n represents a positive integer from 1 to 3 to the carbon atoms on the surface of the polyimide film, thereby modifying the surface of the polyimide film; and forming a copper film on the surface of the modified polyimide film by vacuum evaporation or sputtering of copper.

6. A method according to claim 5, wherein the plasma treatment is performed by an argon plasma.

7. A method according to claim 5, wherein an introduction amount of the oxygen functional group on the surface of said polyimide film is 0.23 to 0.60 as an atomic ratio $Q_O/Q_C$ where $Q_C$ represents the total carbon atoms constituting the surface of the polyimide and $Q_O$ is the number of oxygen functional groups, each partially bonded to a carbon atom.

8. A method according to claim 5, wherein said coupling reaction is performed by a process wherein the polyimide film having said oxygen functional group introduced therein is immersed in an alcohol solution of the silane coupling agent, and then, heating the film coated with the alcohol solution.

9. A method according to claim 5, further comprising forming a copper-electroplated film on the surface of said copper film by electroplating of copper.

10. A method according to claim 5, wherein said silane coupling agent is 2-cyanoethyltrimethoxysilane.

11. A method according to claim 5, wherein said silane coupling agent is 3-cyanopropyltrimethoxysi lane.

* * * * *